United States Patent [19]

Golovanivsky et al.

[11] Patent Number: 5,327,475
[45] Date of Patent: Jul. 5, 1994

[54] SOFT X-RAY SUBMICRON LITHOGRAPHY USING MULTIPLY CHARGED IONS

[75] Inventors: Konstantin S. Golovanivsky, Grenoble, France; Erazm M. Omeljanovsky, New York, N.Y.

[73] Assignee: Ruxam, Inc., New York, N.Y.

[21] Appl. No.: 931,703

[22] Filed: Aug. 18, 1992

[51] Int. Cl.$^5$ .............................................. G21K 5/00
[52] U.S. Cl. ....................................... 378/34; 378/35; 378/143
[58] Field of Search ..................... 378/34, 35, 119, 120, 378/143

[56] References Cited

U.S. PATENT DOCUMENTS

| | | | |
|---|---|---|---|
| 4,088,896 | 5/1978 | Elkins et al. | 378/35 |
| 4,113,514 | 7/1978 | Pankove et al. | 148/1.5 |
| 4,224,084 | 9/1980 | Pankove | 148/1.5 |
| 4,735,877 | 4/1988 | Kato et al. | 378/35 |
| 4,952,273 | 8/1990 | Popov | 156/643 |

OTHER PUBLICATIONS

Garner et al. "An Inexpensive X-ray Source Based On An Electron Cyclotron" Rev. Sci Instrum. 61(2), Feb. 1990, pp. 724-727.
Brynjolfsson "Factors Influencing Economic Evaluation Of Irradiation Processing" Factors Influencing The Economical Application Of Food Irradiation Symposium Proceeding, 14-18 Jun. 1971, 1973, pp.13-35.
Popov, "An Electron Cyclotron Resonance Plasma Stream Source For Low Pressure Thin Film Production" Surface and Coatings Technology, 36 (1988) pp. 917-925.
Product Literature for ECR System 9200, Plasma Stream Sources Models 904, 904GR, 906, 906GR, 908. ECR Ion Miller Model 1M601, ECRJr. Research System, Micromagnitrons, Micro 1000 Heater, Researcher 101, ECR Retrofit by Microscience, nine single pages and one tri-fold document.
Shapoval et al., "Cubic Boron Nitride Films Deposited by Electron Cyclotron Resonance Plasma" Appl. Phys. Lett. 57(18), 29 Oct. 1990, pp. 1885-1886.
Popov "Electron Cyclotron Resonance Plasmas Excited By Rectangular and Circular Microwave Modes" J. V. Sci. Technical A 8(3) May/Jun. 1990 pp. 2909-2912.
Popov et al., "Microwave Plasma Source For Remote Low Energy Ion Stream Rev. Sci. Instrum.," 61 (1), Jan. 1990 pp. 300-302.
Popov et al., "Electron Cyclotron Resonance Sources For Wide and Narrow Plasma Streams", Rev. Sci. Instrum., 61(1), Jan. 1990 pp. 303-305.
Popov et al., "Electron Cyclotron Resonance Plasma Stream Source For Plasma Enhanced Chemical Vapor Deposition" J. Vac. Technol. A 7(3) May/Jun. 1989 pp. 914-917.
Balmashnov et al., "Passivation of GaAs by Atomic Hydrogen Flow Produced by the Crossed Beams Method" Semicond. Sci. Technol., 5 (1990) pp. 242-245.
Omeljanovsky et al. "Hydrogen Passivation of Defects and Impurities GaAs and InP" J. Electronic Materials, vol. 18, No. 6, 1989 pp. 659-670.
Balmashnov et al. "CERA-C: The System For Hydrogenation of Semiconductors by the method of Crossed Beams", Contributed Papers of XX International Conference on phenomena in ionized Gases, Pisa, Italy, Jul. 1991.

(List continued on next page.)

Primary Examiner—David P. Porta
Attorney, Agent, or Firm—Davis Hoxie Faithfull & Hapgood

[57] ABSTRACT

Apparatus and methods for submicron lithography of semiconductor materials, circuits and other objects. A source of multiply charged ions is applied to a thin layer of electrically conductive material. The recombination of ions and free electrons in the layer produce soft x-ray radiation which used to irradiate an object. The object may include a semiconductor substrate, an x-ray sensitive resist, and an x-ray absorbing mask for forming semiconductor circuit devices. The soft x-rays are produced by careful selection of the type and energy of multiply charged ions and the thickness of the thin electro-conductive layer, which may be a light element metal.

31 Claims, 5 Drawing Sheets

OTHER PUBLICATIONS

Polyakov, et al. "The Effect of Hydrogen On Bulk And Surface Traps In Indium Antimonide", Solid State Communications, vol. 74, No. 8, pp. 711–715 (1990).

Polyakov et al. "Atomic Hydrogen Passivation of Deep Levels Activity In $Al_xGa_{1-x}A_s$ Multiquantum Well Structures", Solid State Communication vol. 76, No. 6, pp. 761–763 (1990).

Pakhomov et al., "Atomic Hydrogen Modification of Polycrystalline Silicon Solor Cells Characteristics", Solid State Communications, vol. 76, No. 7, pp. 887–890 (1990).

Barbour et al. "Silicon Nitride Formation from a Silane–Nitrogen Electron Cyclotron Resonance Plasma", J. Vac. Sci. Technol-A, vol. 9, No. 3, May/Jun. 1991, pp. 480–484.

Knox et al. "Characterization of Electronic and Optical Properties of Device Quality a-Si:H and a-(Si,Ge):H grown by remote plasma electron cyclotron Resonance deposition", J. Vac. Sci Technol A, vol. 9, No. 3, May/Jun. 1991 pp. 474–479.

Popov, "Effects of Magnetic Field and Microwave Power on Electron Cyclotron Resonance Type Plasma Characteristics" J. Vac. Sci. Technol A, vol. 9, No. 3, May/Jun. 1991 pp. 711–716.

Conrad et al., "Plasma source ion-implantation technique for Surface Modification of Materials", J. Appl. Phy., vol. 62, No. 11, Dec. 1987, pp. 4591–4596.

Hirano et al. "Extension of Bearing Endurance Life By Ion Implantation" Appl. Phys. Lett., vol. 49, No. 13, 29 Sep. 1986, pp. 779–781.

J. P. Briand et al., "Production of Hollow Atoms by the Excitation of Highly Charged Ions in Interaction with a Metallic Surface", Physical Review Letters, Jul. 9, 1990.

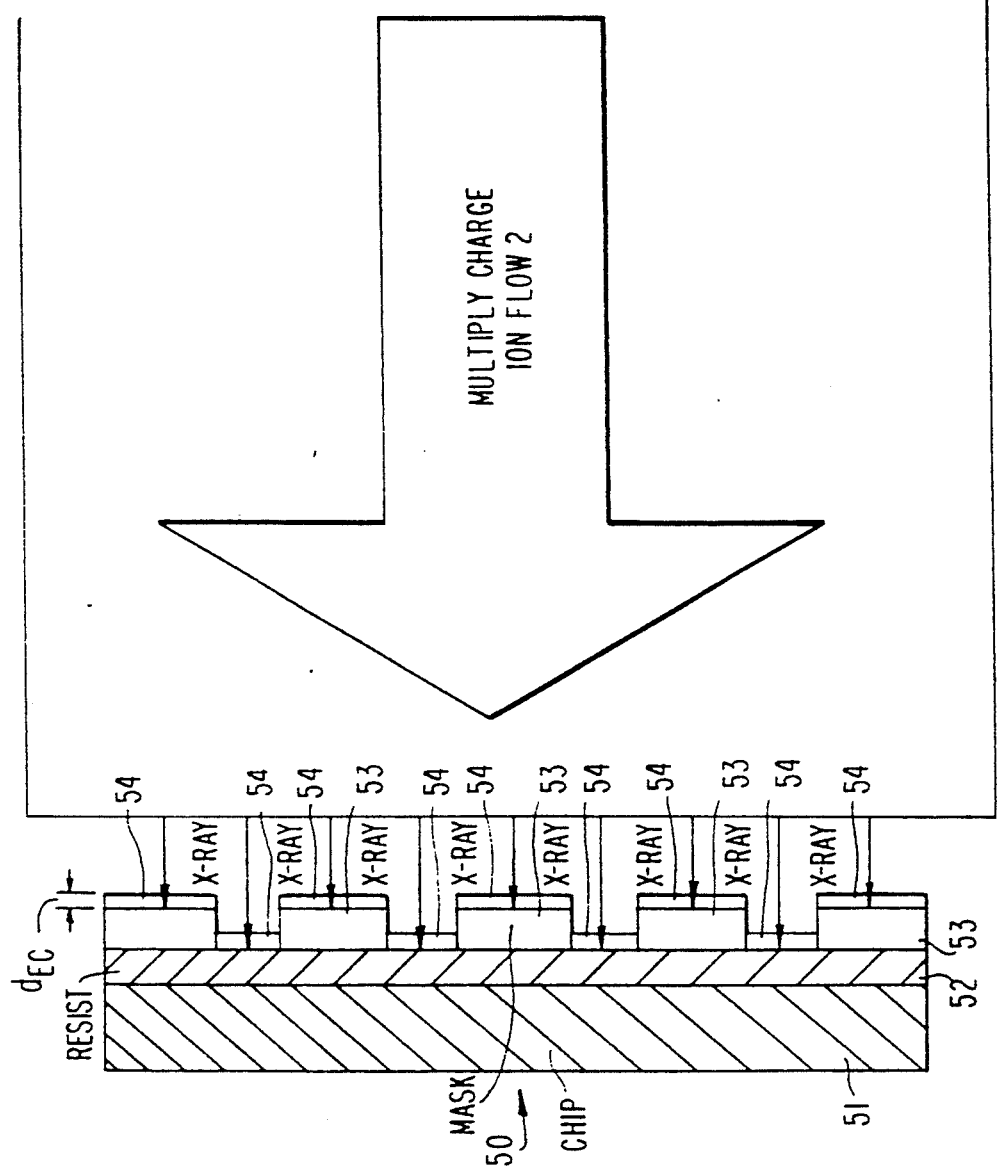

SOFT X-RAY SUBMICRON LITHOGRAPHY USING MULTIPLY CHARGED IONS

FIELD OF THE INVENTION

This invention relates to lithographic processing of semiconductor substrates, more particularly to soft x-ray lithography using a source of multiply charged ions for achieving submicron line resolution on the substrate.

BACKGROUND OF THE INVENTION

It is desired to increase the effective resolution of lithographic techniques for manufacturing integrated circuits. One suggested approach is to use x-ray lithography with the photon energy ranging between 0.1 and 1 keV (the so-called "soft+ x-ray). It is believed that soft x-ray lithography is the next step, after the visible and ultraviolet light lithography, to achieve a deep submicron resolution for fabrication of integrated circuits and semiconductor devices.

One problem with using soft x-rays is the absence of a source that is sufficiently intense and inexpensive to produce soft x-ray radiation in the desired photon energy range. Only the radiation produced by the curved very high energy electron beam (around 1 billion eV) of a synchrotron is now regarded as a potential candidate for the soft x-ray source for submicron lithography.

However, the known sources of the synchrotron radiation are extremely complicated, expensive, and delicate machines. They are principally used in physics research. In the present moment and in the near future they apparently will not be available for the massive industrial manufacturing of deep submicron resolution integrated circuits.

OBJECTS AND SUMMARY OF THE INVENTION

It is an object of the present invention to provide a relatively inexpensive source of soft x-rays for submicron lithography. It is another object to provide a simple and reliable method of soft x-ray submicron lithography using actually available, relatively inexpensive and easily accessible and available equipment. It is another object to provide soft x-ray submicron lithography apparatus and methods for industrial manufacturing of integrated circuits in bulk and in volume.

Broadly, the invention concerns a source of the soft x-rays that is the radiation produced by multiply charged ions during their interaction with free electrons on the surface of a layer of material, such as a layer of an electrically conductive metal or semiconductor material. A portion of the emitted x-ray photons penetrate through the layer (metallic or semiconductor) which has delivered free electrons to neutralize multicharged ions impinging on one side of the layer, and may be used to irradiate a target object placed proximate to the other side of the layer.

One aspect of the invention thus concerns a system for soft x-ray lithography including an object to be irradiated by the soft x-ray; a thin layer of a light electro-conductive material, which is to cover the object surface; and a multiply charged ion beam.

The object to be irradiated is a standard object. In the simplest case, it comprises a thin substrate to be transformed into an integrated circuit, a resist layer which is sensitive to a soft x-ray (either a positive- or negative-type resist), and a mask made of a material that absorbs the soft x-ray.

The thin electro-conductive layer for covering the object accomplishes several functions. These include (1) providing a source of free electrons to neutralize multiply charged ions near the irradiated object; (2) permitting soft x-ray photons to penetrate through its body without significant damping; (3) filtering parasite long wavelength photons which are radiated together with useful soft x-ray photons during the multiply charged ion - free electron interaction; and (4) inhibiting energetic neutral atoms from appearing as a result of ion-electron interaction, in order to minimize damaging the object surface.

The thin electro-conductive layer is preferably a light element electro-conductive material which is transparent to the soft x-ray and a good source of free electrons. Among light elements beryllium and aluminum are preferred in that they may be grounded and thus prevent the formation of an electrostatic charge on the surface by the falling ion beam. These materials also are light in weight, easy to treat, and relatively inexpensive.

The multiply charged ion beam may be provided by any source that continuously supplies ions which are adequate to generate photons at the desired energy (or wavelength) during the ion-electron interaction (ion neutralization) near a conductive (metallic or semiconductor) surface.

In one embodiment, the multiply charged ions are extracted from an appropriate ion source such as, for example, an Electron Cyclotron Resonance (ECR) ion source. The energy of ions in a beam delivered by the ion source is equal to $Z \times V$, where V is the extraction voltage (commonly ranging around 10 kilovolts) and Z is the charge state of the ions. In accordance with the present invention, highly charged ions are required. Therefore, Z is preferably several (up to 10 or more) units, so that the ion energy near the neutralizing layer can accumulate up to many tens of keV. This implies the use of a sufficiently thick neutralizing layer. Advantageously, the thickness can be reduced by decelerating the ions down to an optimal value of energy (several keV), before they interact with the conductive layer surface. A conventional electrostatic decelerating device may be used for this purpose.

Another aspect of the present invention is directed to processing massive integrated circuits using soft x-ray lithography. One such method includes a sequence of successive operations including:

(a) preparing in a standard way a standard object to be irradiated by the soft x-ray, the object including a substrate, an x-ray sensitive resist material coated on the substrate, and an x-ray absorbing mask material coated over the resist;

(b) covering the mask side of the standard object, including the portions of the resist not covered by the mask material, with a thin layer of a light conductive material;

(c) exposing the light conductive material to a multiply charged ion flux;

(d) removing the conductive layer; and (e) processing the irradiated standard object to develop the resist, e.g., to remove the mask and the exposed (or unexposed) resist.

Preferably, the exposing step (c) is conducted under high vacuum ($<1 \times 10^{-7}$ mbar) conditions. This is to exclude a change of the charge state of ions due to the collisions with residual neutral molecules or atoms.

BRIEF DESCRIPTION OF THE DRAWINGS

Further features of the invention, its nature and various advantages, will be more apparent from the accompanying drawings and the following detailed description of the invention, in which like reference numerals refer to like elements, and in which:

FIG. 3 is a block diagram illustrating the soft x-ray submicron lithographic process in accordance with an embodiment of the present invention;

DETAILED DESCRIPTION OF THE INVENTION

Figure 1:
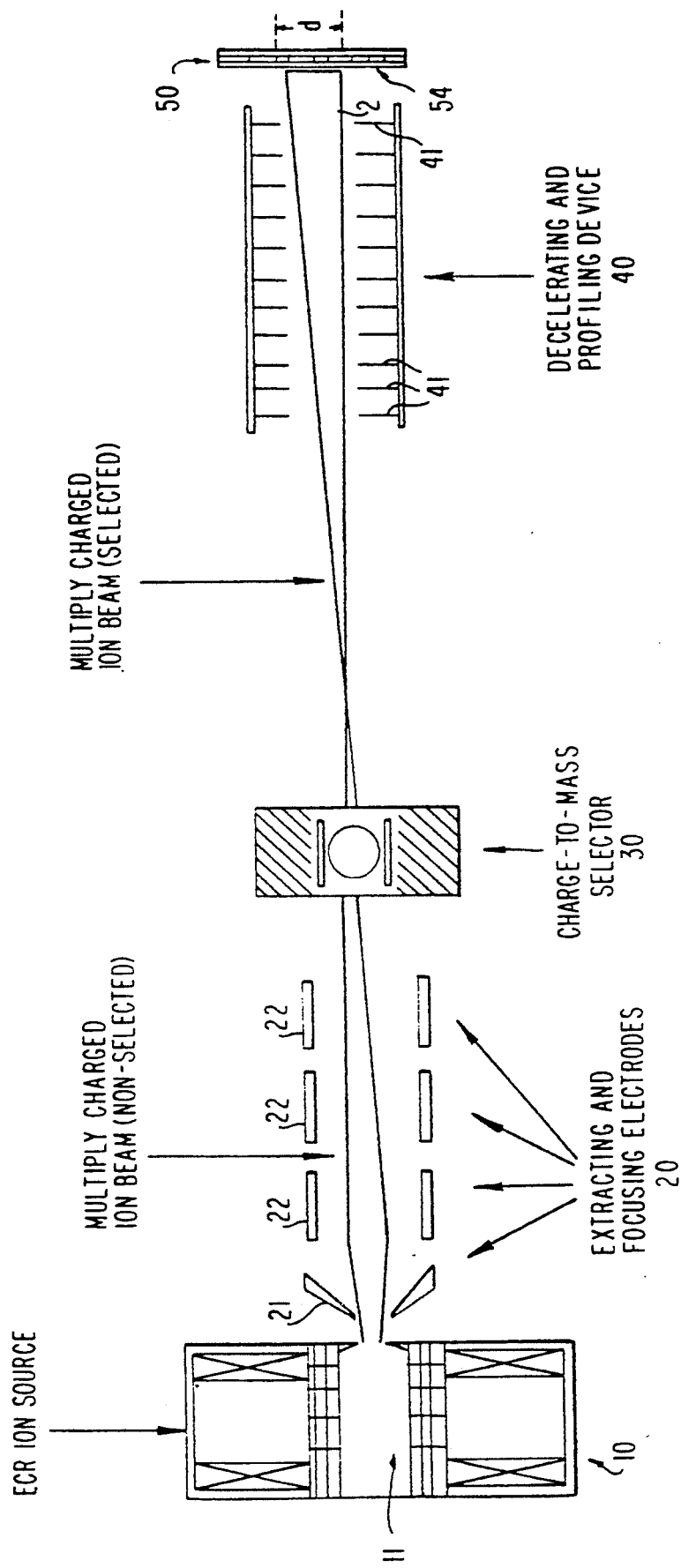
FIG. 1 is a side sectional view of a soft x-ray submicron lithographic apparatus in accordance with an embodiment of the present invention.

A device which generates and delivers a multiply charged ion flux 2 to the surface of a neutralizing thin conduction layer 54 for treating an object 50, in accordance with a preferred embodiment of the present invention, is illustrated in FIG. 1. One such apparatus delivers an energetic focalized ion beam 2 which contains ions in various charge states. It includes an ECR ion source 10, a set of electrodes 20 for extracting ions from the source 10 and focusing the extracted ions, a charge-to-mass selector 30, and a system 40 for decelerating and profiling the ion beam 2.

ECR ion source 10 is a standard one and works in the frequency band on the order of 10 GHz or more. Such ion sources are described in R. Geller, *Annual Rev. Nucl. Part. Sci.*, Vol. 40, pp. 15–43 (1990).

Electrodes 20 for ion extraction and beam focusing function to extract ions from the plasma generated in the ion source 10 and focus the extracted ions in a conventional manner. Typically, the focal point is selected between charge to mass selector 30 and the target (object 50) so that the ion beam is diverging as it approaches layer 54. Preferably, electrodes 20 include a conical electrode 21 and a set of three cylindrical electrodes 22. Conical electrode 21 is preferably grounded while source 10 is maintained at a positive extracting potential (approximately 10 kV). The set of cylindrical electrodes 22 form a standard focussing Einzel length.

Charge-to-mass selector 30 selects a required charge-to-mass component of the extracted ion beams. It is a standard element such as a Wien filter or a bending magnet.

The decelerating and profiling system 40 transforms the diverging energetic beam into a homogenous, slow ion flow 2 having a diameter d at the surface of layer 54. The diameter d corresponds to the surface area of the object 50 to be x-ray irradiated and is preferably selected to irradiate completely the surface of object 50 with soft x-rays.

Decelerating system 40 is a commonly used set of axially symmetric electrodes 41, the positive potential of which gradually increases so that the ions are permanently decelerated when approaching target 50. The target 50 also is maintained at a positive potential, which finally determines the energy of ion bombardment. For example, if the extracting potential is +10 kV then the target potential can be chosen between zero and +9 kV. If the target potential is chosen to be zero, decelerating system 40 is not necessary and the bombardment energy is z·10 KeV. If the target potential is +9 kV, then the bombardment energy is z (10−9) keV. As already noted, Z is the ion charge state.

Any other system which is able to generate an appropriate ion flux, which may be diverging, converging or parallel at the surface of layer 54, also can be used. As noted, the decelerating and profiling system 40 may be omitted if layer 54 is made sufficiently thick.

Referring to FIG. 3, object 50 includes a substrate 51 to be treated, e.g., an integrated circuit or a semiconductor wafer or device, an x-ray sensitive resist 52, an x-ray absorbing mask 53, and layer 54 of conductive material covering the mask 53 and the portion of resist 52 not covered by mask 53. Mask 53 contains a pattern or image to be formed in the substrate 51 by etching, doping or other subsequent processing step, e.g., a pattern for one step of forming an integrated circuit. Layer 54 may be applied by evaporation, sputtering or any other technique. The resist and masks are applied in an appropriate and conventional manner for submicron x-ray lithography.

Regarding the multiply charged ion source, consider a Hydrogen-like (H-like) ion of the atomic number Z which approaches a metallic surface. That ion has only one electron on the K-shell. The second place on that shell is vacant. The L-, M-, N- etc. shells in this H-like ion are empty.

As is known from J.P. Briand et al., *Phys. Rev. Letters*, Vol. 65, No. 2, p. 159, Jul. 9, 1990, at a small distance of a few nanometers from the metallic surface, a strongly charged ion perturbs the potential barrier on the metal surface. The perturbation is so much that free electrons can leave the metal to recombine with this multiply charged ion. During the recombination, the electrons cascade from the external shells to the internal shells. The cascade is accompanied by a number of photon emissions.

The energy of each photon (or the emission wavelength) depends on the energy difference between upper and lower energy levels during the each step of the electron cascade. For an H-like ion there is only one vacancy on the most energetic K-level. So, the most energetic photon is emitted when this vacancy is occupied by an electron coming from one of higher levels (L-, M-, N-, etc.) or from continuum.

The bound energy is rapidly decreasing when passing from the K-level to the L-, M-, N-, etc. levels. Therefore, the most intensive emission during the recombination of a large number of H-like ions near a metallic surface is concentrated in the photon energy range $$E_K > E_{PH} > E_K - E_L \tag{1}$$

where $E_K$ and $E_L$ are the bound energy at the K- and L-shell respectively, and $E_{PH}$ is the photon energy. In practice when a large number of multiply charged H-like ions are recombining near the metallic surface, the photons emitted have energy mostly in a narrow band, nearly 5% wide, around the energy value:

$$E_{PH} \simeq E_K - E_L \tag{2}$$

For the light elements, this energy range corresponds to the wavelengths suitable for the deep-submicron x-ray lithography.

Figure 2A:
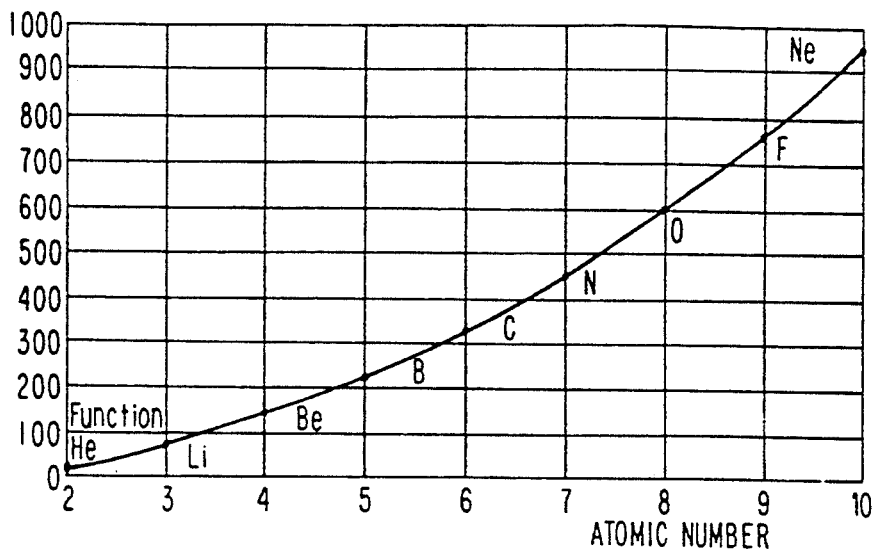
FIG. 2a is a plot of the photon energy (eV) versus atomic number for a plurality of elements.
Figure 2B:
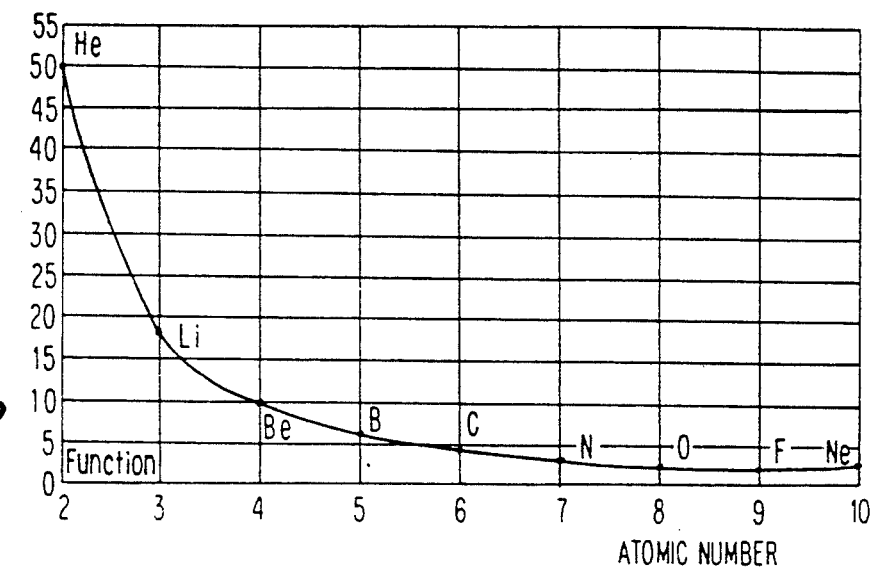
FIG. 2b is a plot of the wavelength (nm) versus atomic number for a plurality of elements.

Referring to FIGS. 2a and 2b, the photon energy in electron-Volts (FIG. 2a) and the corresponding wavelength in nanometers (FIGS. 2b) conform to the formula (2) for the H-like ions of the first and the second lines of the Periodic Table of Elements. As is illustrated on these Figs., the photon energy ranges between about 24 eV for Helium and about 960 eV for Neon. The corresponding radiation wavelength is between 51 nm for Helium and 1.3 nm for Neon.

Figure 2C:
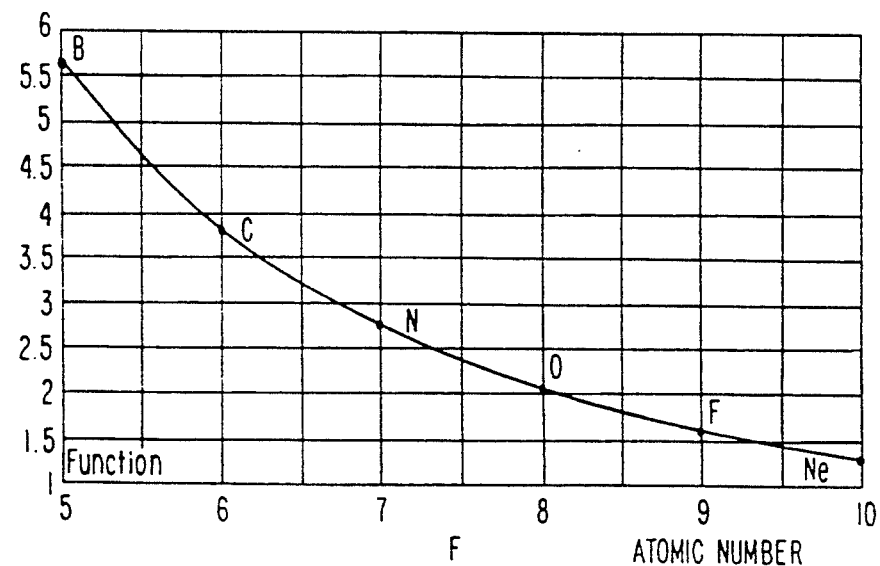
FIG. 2c is a expanded plot of a portion of FIG. 2b.

In accordance with the present invention, the preferred radiation wavelength band for the x-ray lithography is the band lying between Boron H-like ions and Neon H-like ions. The corresponding wavelengths in a magnified scale are illustrated on the graph of FIG. 2c.

The present invention is not limited to the H-like ions which are but one example. Other kinds of the multiply charged ions, such as completely stripped nuclei or He-like, Li-like, Be-like, etc. ions, are believed to be suitable to produce soft x-ray emissions during the ion-electron interaction on the electro-conductive surface.

Referring to FIG. 3, the depth or thickness $d_{EC}$ of the thin electro-conductive layer 54 is quite critical. It must be chosen with care, taking into account such effects as energetic atoms penetration, sputtering and transparency for the soft x-ray, ultraviolet and visible light.

The energetic atomic particle penetration into a solid target depends upon the atomic numbers $Z_1$, $Z_2$ and atomic mass $A_1$, $A_2$ of the projectile 1 and target 2, respectively, and also upon the kinetic energy of the projectile. The range of the incoming particle, expressed in microns, is given by the following formula from J W. Mayer, L Erickson, J.A. Davies, "Ion Implantation in Semiconductors" Academic Press, New York, p 25, 1970:

$$R = \frac{60 \cdot A_2 \cdot (A_1 + A_2)(Z_1^{2/3} + Z_2^{2/3})^{1/2}}{Z_1 \cdot Z_2 \cdot A_1 \cdot g} \cdot E$$

where g is the target material density in gram/cm$^3$, E is the projectile energy in keV.

The depth of penetration $R_p$ is expressed through R (from N. Laegried et al., J. Appl. Phys., v. 32, p. 356, 1961), as follows:

$$R_p = R \left(1 + \frac{A_2}{3A_1}\right)^{-1}$$

Figure 4:
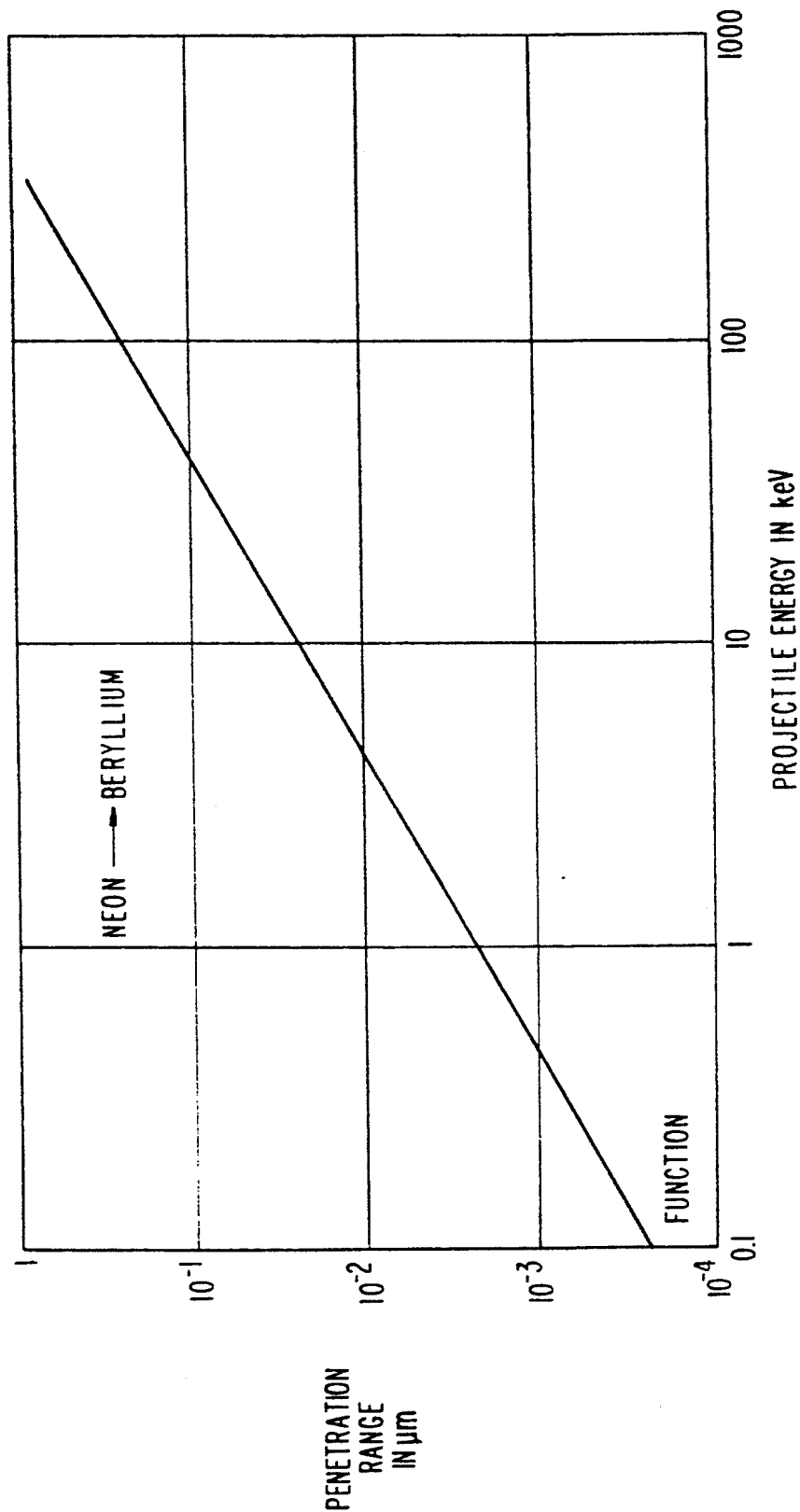
FIG. 4 is a plot of the penetration range (nm) as a function of the projectile energy (keV) for neon ions bombarding a beryllium target.

An example of $R_p$ as a function of the projectile energy when the incoming particles are the Neon ions and the target material is Beryllium is illustrated in FIG. 4. As seen on this graph, to catch ions of about 10 keV, the layer depth of 0.05 microns is quite sufficient, while at the energy of about 100 keV, the required layer depth should be on the order of 0.5 microns.

The sputtering of the layer atoms due to the energetic atoms bombardment also is a phenomenon affecting the optimal layer depth. Indeed, the sputtering yield of a Beryllium target bombarded by the Neon ions or atoms in the energy range between 1 keV and 100 keV is about 0.5 sputtered atoms per 1 incoming ion. H.E. Schiott, Can. J. Phys., v. 46, p. 449, 1968. For a current density of 40 $\mu$A/cm$^2$ of Ne$^{+9}$ ions, the incoming atoms flux will be $2.8 \times 10^{13}$ atoms per cm$^2$ per second. At the above-mentioned sputtering yield, the target will lose $1.4 \times 10^{13}$ atoms from each cm$^2$ of its surface every second. This sputtering rate will result in a decrease of the target layer depth at a rate of $2.9 \times 10^{-6}$ microns per second.

As an example, if the exposure time is as long as 1 minute, then the depth of the layer will lose about $1.7 \times 10^{-4}$ microns during exposure. This value is many times smaller than the minimal depth implied by the ion penetration effect.

Regarding the transparency of the layer 54 to the x-ray, a condition for low absorption of the x-ray in a matter is that the photon energy ranges between two absorption edges, for example, between L-edge and K-edge, or is larger than K-edge for the given material. In the case of Beryllium, the K-edge corresponds to 158 eV. So, with reference to FIG. 2a, the photon emitted by H-like ions heavier than the Beryllium atoms are not strongly absorbed. Analyzing data given in A.E. Sandstrom, Handbuch der Physik, v. 33, p. 85, Springer Verlag, 1957, it is apparent that a Beryllium layer about 0.5 microns thick is nearly 100% transparent for photons of energy ranging >200 eV, and provides good protection against less energetic parasite photons.

Generally, the depth $d_{EC}$ of the conductive layer 54 is selected, in view of the foregoing, as a careful optimization based upon the selected kind of ions and the layer material.

The efficiency of the soft x-ray lithography according to the present invention, particularly the exposure time, is a function of the intensity of the multiply charged ions beam, i.e., of the number of ions incoming every second to every cm$^2$ of the neutralizing thin conductive layer surface. The known existing ECR ion sources provide 0.2 mA (electrical) of H-like ions for first two lines of the Periodic Table of Elements. R. Geller, Annual Review Nucl. Part. Sci., Vol. 40, p. 39 (1990). Further increases of intensity are expected in the near future. In any event, the available 0.2 mA are still sufficient to produce high enough intensity of the soft x-ray. Indeed, at this value of the Ne$^{+9}$ ion current, as mentioned above, each cm$^2$ of the neutralizing layer receives $2.8 \times 10^{13}$ ions per second. Each ion produces one useful photon, so that the neutralizing thin conductive layer 54 radiates $2.8 \times 10^{13}$ appropriate photons per second from each cm$^2$ of its surface. The photon energy in this case is 960 eV. Therefore, the x-ray energy emitted each second from 1 cm$^2$ of surface of the thin conductor layer 54 is $2.8 \times 10^{13}$ [1/second] $\times 960$ [eV] $\times 1.6 \times 10^{-19}$
[Joule/eV] = 4 milliwatt/cm$^2$ One half of this energy goes to the object, i.e., the integrated circuit, and the other half is radiated back away from the integrated circuit. Thus, the integrated circuit in this case is irradiated by 2 milliwatt/cm$^2$ of the 1.3 nanometer wavelength x-ray.

At the sensitivity of the resist 52 (see FIG. 3) of 50 millijoule/cm$^2$ the exposure time is 25 seconds (assuming that the neutralizing thin conductive layer is perfectly transparent). This exposure time is quite competitive for industrial mass production of circuits and devices. However, the exposure time can be reduced even more if the back-going fraction of the x-ray is reflected back through layer 54 to the integrated circuit layer 51 using any one of the conventional methods and devices (multilayer mirrors, mosaic mirrors, etc.).

When using not H-like ions, but more heavy He-like, Li-like, etc., ions, the number of emitted photons per ion is correspondingly 8, 7, etc. In these cases the exposure time could be remarkably shorter if the ion beam intensity is maintained at the same or not much lower level, although the energy spread will be somewhat larger, remaining however, low enough.

Figure 5:
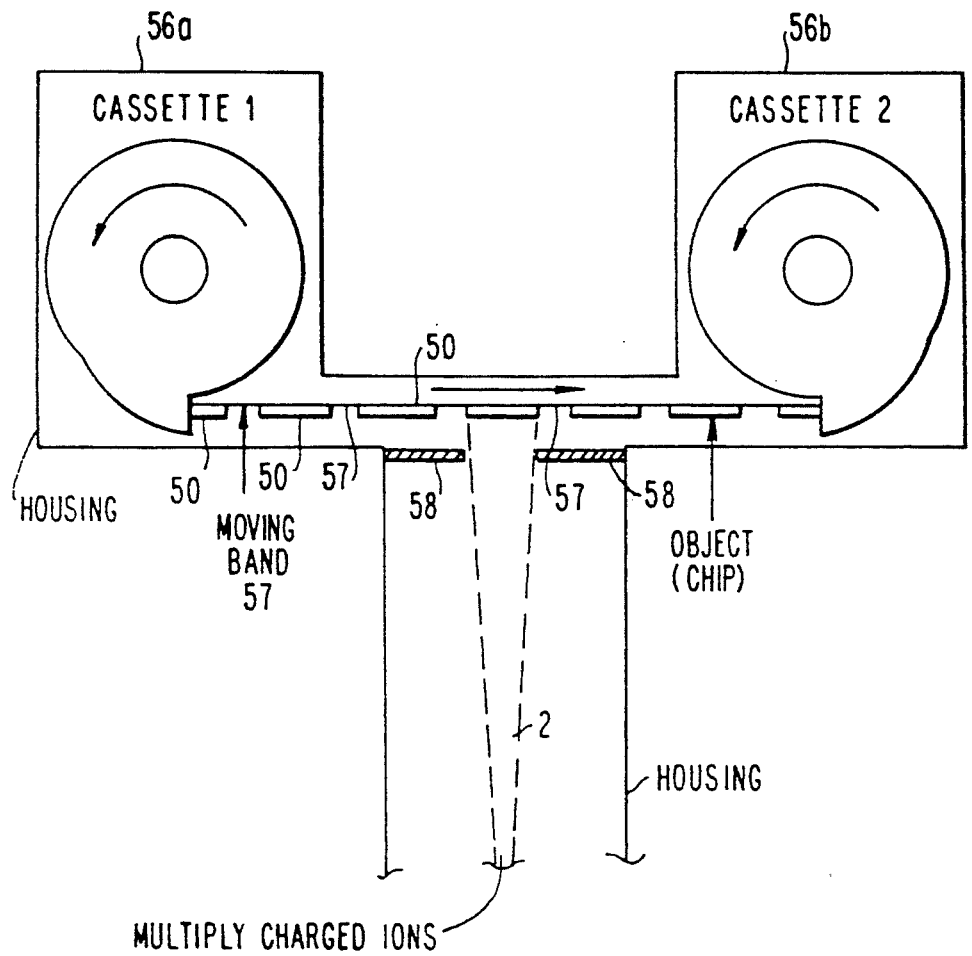
FIG. 5 is a side sectional view of an apparatus for the mass production of semiconductor chips in accordance with the present invention.

Referring to FIG. 5, an arrangement for industrial mass production of identical objects 50 to be irradiated by a multiply charged ion beam 2, is shown. In this embodiment, a plurality of identical objects 50 are spaced apart a uniform distance along a continuous band 57, which may be a plastic film, so that layer 54 will face ion beam 2 in a work area. The band 57 is advanced so that the objects 50 are passed through the work area where the ion flow 2 irradiates one object 50 at a time. An aperture 58 may be used to define the work area. If aperture 58 is made from an x-ray absorbing material, it can be used to assist in controlling the work area and the x-ray exposure.

Preferably, band 57 and its plurality of objects 50 are initially housed in a cassette 56a, similar to photographic film. Band 57 and, hence, objects 50, preferably secured thereto, are then advanced to and wound on a take-up cassette 56b in such a way that each object 50 stays within work area irradiated by the ion flow 2 during the selected exposure time. A housing (not shown) may enclose ion beam 2 and cassettes 56a and 56b which can be evacuated by a conventional pump (also not shown) to operating pressures of, e.g., from $1 \times 10^{-7}$ to $0.5 \times 10^{-7}$ Torr. Such an operating mode allows to irradiate a number of objects 50 while maintaining a sufficient vacuum with minimal ambient particles. Preferably, the portion in the housing containing one or both of the cassettes can be placed at atmospheric pressure, i.e., not in any vacuum, while the vacuum conditions are maintained in the ion beam area. This may be accomplished by appropriate evacuation using, e.g., one or more pumps and suitable vacuum-tight shielding or by placing a vacuum seal (not shown) over aperture 58 when a cassette is to be changed.

The x-ray exposure time is cumulative. Therefore, band 57 may be advanced intermittently or continuously, or a combination of both, in a single pass or a multiple pass exposure sequence to expose adequately each object 50. Thus, different objects in the same cassette 56a can be provided with different adequate x-ray exposures by controlling the ion source production and by advancing band 57 between cassettes accordingly. Any structure may be used to move objects 50 continuously or intermittently through the ion irradiated area of layer 54 to obtain the necessary cumulative exposure time.

One skilled in the art will appreciate that the present invention can be practiced by other than the described embodiments, which are presented for purposes of illustration and not of limitation.

What is claimed is:

1. A method for x-ray lithography on a material comprising the steps of:
   b) placing a mask over the resist wherein the mask is not transparent to x-rays and contains a pattern so that some of the resist is not covered by the mask;
   c) providing a layer of material over the mask and the not covered resist, the layer containing free electrons; and
   d) irradiating the layer of material with multiply charged ions so that the ions interact with free electrons and produce soft x-ray photons having a photon energy between 0.1 and 1 keV for sensitizing the resist.

2. The method of claim 1 wherein step c) further comprises providing a layer of electrically conducting material.

3. The method of claim 2 further comprising grounding the layer of electrically conducting material to minimize the accumulation of an electrostatic charge.

4. The method of claim 2 wherein the electrically conducting material is a light element.

5. The method of claim 2 wherein step c) further comprises providing a layer of semiconductor material and minimizing the accumulation of an electrostatic charge on the semiconductor.

6. The method of claim 1 wherein step c) further comprises providing the layer with a thickness of about 0.05 microns for every 10 keV of ion energy in the irradiating ion beam.

7. The method of claim 1 wherein step d) further comprises irradiating the layer with multiply charged ions selected from among one of helium, lithium, beryllium, boron, carbon, nitrogen, oxygen, fluorine and neon H-like ions.

8. The method of claim 1 wherein step d) further comprises irradiating the layer with multiply charged ions selected from among one of stripped nuclei, helium-like, lithium-like, beryllium-like, boron-like, carbon-like, nitrogen-like, oxygen-like, fluorine-like and neon-like ions.

9. The method of claim 1 wherein step d) further comprises:
   i) providing a source of multiply charged ions;
   ii) extracting an ion beam from the source;
   iii) focussing the extracted ion beam; and
   iv) providing the ion beam with a selected beam cross section for irradiating the layer on an object.

10. The method of claim 9 wherein step d)iv) further comprises:
    v) selecting the charge to mass of the focussed multiply charged ion beam to be in a selected range.

11. The method of claim 9 wherein step d)iv) further comprises:
    v) decelerating and profiling the focussed multiply charged ion beam to produce a slow, homogenous ion beam for irradiating the layer on the object, wherein the ion beam has a photon energy of the order of several keV.

12. The method of claim 1 further comprising reflecting toward the layer x-rays that are produced by the ion electron interaction in a direction away from the layer.

13. Apparatus for use in irradiating an object with multiply charged ions comprising:
    an ion source;
    electrodes for extracting multiply charged ions from the ion source and forming an ion beam;
    a selector for selecting ions having a charge to mass ratio within a predetermined range;
    a system for converting the selected ion beam into a homogenous slow ion flow, wherein the ion beam has a photon energy of the order of several keV; and
    a holder for positioning an object to be irradiated into the ion beam flow.

14. The apparatus of claim 13 further comprising a reflector for reflecting x-rays, the reflector being located to reflect x-rays toward the holder.

15. The apparatus of claim 13 wherein the converter system provides the ion beam with a diameter at the holder sufficient for processing an object on the holder.

16. The apparatus of claim 15 wherein the converter system further comprises a plurality of axially symmetric electrodes for decelerating and profiling the extracted ion beam.

17. Apparatus for soft x-ray lithographic processing of a plurality of objects comprising:
a source for producing a beam of multiply charged ions;
a band of material for supporting a plurality of objects;
a plurality of objects to be irradiated, the objects having a thin layer of a light element electro-conductive material including free electrons and being spaced apart along the band; and
means for advancing the band relative to the ion beam for irradiating each object with soft x-rays produced by interaction of the multiply charged ions and free electrons.

18. The apparatus of claim 17 wherein the advancing means advances the objects intermittently with a dwell time selected to expose each object to a sufficient cumulative dose of x-ray radiation.

19. The apparatus of claim 17 wherein the advancing means advances the objects continuously at a speed selected to expose each object to a sufficient cumulative dose of x-ray radiation.

20. The apparatus of claim 17 wherein the advancing means further comprises a first cassette and a second cassette, the objects being initially wound on a portion of the band in the first cassette and being exposed to x-ray radiation as the band and objects are advanced from the first cassette to the second cassette.

21. The apparatus of claim 20 further comprising a housing for maintaining a reduced pressure in the range of from $1.0 \times 10^{-7}$ to $0.5 \times 10^{-7}$ Torr, the housing containing the first and second cassettes, the band, and the multiply charged ion beam.

22. The apparatus of claim 21 wherein the plurality of objects are secured to the band, whereby the first and second cassettes are removable from the housing so that the plurality of objects can irradiated while preserving the reduced pressure in the housing.

23. The apparatus of claim 17 further comprising a reflector for reflecting x-rays produced from the thin electro-conductive layer in a direction away from an object back toward the object.

24. The apparatus of claim 17 further comprising a member having an aperture for passing multiply charged ions through the aperture onto a work area.

25. The apparatus of claim 22 wherein the advancing means advances the band and the objects intermittently with a dwell time selected to expose each object to a sufficient cumulative dose of x-ray radiation.

26. The apparatus of claim 22 wherein the advancing means advances the objects and the band continuously at a speed selected to expose each object to a sufficient cumulative dose of x-ray radiation.

27. The apparatus of claim 17 wherein the advancing means further comprises a first cassette and a second cassette, the band being initially wound on the first cassette and being exposed to x-ray radiation as it is advanced from the first cassette to the second cassette.

28. The apparatus of claim 27 further comprising a housing for maintaining a reduced pressure in the range of from $1.0 \times 10^{-7}$ to $0.5 \times 10^{-7}$ Torr, the housing containing the first and second cassettes and the multiply charged ion beam.

29. The apparatus of claim 28 wherein the first cassette initially contains the plurality of objects secured to the band, whereby the first and second cassettes are removable from the housing so that the plurality of objects can irradiated while preserving the reduced pressure in the housing.

30. The apparatus of claim 29 further comprising a pump for maintaining a reduced pressure in the ion beam area while one or the first and second cassettes are at atmospheric pressure.

31. The method of claim 4 wherein the light element is selected from among one of beryllium and aluminum.

* * * * *

UNITED STATES PATENT AND TRADEMARK OFFICE
CERTIFICATE OF CORRECTION

PATENT NO. : 5,327,475
DATED : July 5, 1994
INVENTOR(S) : Golovanivsky, et al.

It is certified that error appears in the above-indentified patent and that said Letters Patent is hereby corrected as shown below:

Col. 1, line 18, ""soft+" should be -- "soft" --.

Col. 4, line 59, "$E_K>E_{PH}>E_K-E,$" should be -- $E_K>E_{PH}>E_K-E_L$ --.

Col. 4, line 68, "(2)" should be at the right margin.

Col. 10, line 27, "0 5" should be -- 0.5 --.

Column 7. line 60:

Claim 1, after "the steps of:" insert -- a) providing the material with an x-ray sensitive resist layer; --

Signed and Sealed this

Twentieth Day of June, 1995

Attest:

BRUCE LEHMAN

Attesting Officer       Commissioner of Patents and Trademarks